United States Patent
Takita et al.

(10) Patent No.: US 6,992,944 B2
(45) Date of Patent: Jan. 31, 2006

(54) SEMICONDUCTOR MEMORY DEVICE WITH REDUCED POWER CONSUMPTION FOR REFRESH OPERATION

(75) Inventors: Masato Takita, Kawasaki (JP); Kuninori Kawabata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/079,427

(22) Filed: Mar. 15, 2005

(65) Prior Publication Data

US 2005/0157582 A1   Jul. 21, 2005

Related U.S. Application Data

(63) Continuation of application No. PCT/JP2003/005203, filed on Apr. 23, 2003.

(51) Int. Cl.
  *G11C 7/00* (2006.01)

(52) U.S. Cl. .................... 365/222; 365/189.12

(58) Field of Classification Search ........... 365/222, 365/189.12, 189.05, 230.03
  See application file for complete search history.

(56) References Cited

U.S. PATENT DOCUMENTS

| | | | |
|---|---|---|---|
| 5,410,513 A | 4/1995 | Masuda et al. | |
| 5,444,660 A | 8/1995 | Yamanaka et al. | |
| 5,448,530 A | 9/1995 | Masuda et al. | |
| 5,668,772 A | 9/1997 | Hotta | |
| 6,134,179 A * | 10/2000 | Ooishi | 365/233 |

FOREIGN PATENT DOCUMENTS

| | | |
|---|---|---|
| EP | 1335383 A1 | 8/2001 |
| JP | 52-146135 A | 5/1977 |
| JP | 1-260696 A | 10/1989 |
| JP | 3-252991 A | 11/1991 |
| JP | 2-214099 A | 10/1992 |
| JP | 4-305889 A | 10/1992 |
| JP | 5-198163 A | 8/1993 |
| JP | 5-342847 A | 12/1993 |
| JP | 9-139067 A | 5/1997 |
| JP | 2000-311487 A | 11/2000 |
| JP | 2002-150770 A | 5/2002 |

* cited by examiner

*Primary Examiner*—Vu A. Le
(74) *Attorney, Agent, or Firm*—Arent Fox PLLC

(57) ABSTRACT

A semiconductor memory device includes a plurality of word decoders arranged in a plurality of columns, a plurality of word line selecting shift registers corresponding to the respective word decoders to indicate a word line subjected to refresh operation, and a shift control signal generating circuit operable to supply a shift control signal indicative of timing of shift operations to the plurality of word line selecting shift registers, wherein the said shift control signal generating circuit is configured to supply the shift control signal only to a column currently subjected to refresh operation among the plurality of columns.

10 Claims, 19 Drawing Sheets

SEMICONDUCTOR MEMORY DEVICE WITH REDUCED POWER CONSUMPTION FOR REFRESH OPERATION

CROSS-REFERENCE TO RELATED APPLICATION

This is a continuation of International Application No. PCT/JP2003/005203, filed on Apr. 23, 2003, the entire contents of which are hereby incorporated by reference.

BACKGROUND OF THE INVENTION

1. Field of the Invention

The present invention generally relates to semiconductor memory devices, and particularly relates to a semiconductor memory device which performs refresh operations for retaining stored data.

2. Description of the Related Art

There is a strong demand for low power consumption with respect to semiconductor devices for use in portable equipment.

In DRAMs that store data in memory capacitors, refresh operations are constantly performed to retain information stored in the cells by successively activating word selecting lines to read cell data, amplifying the data potentials by use of sense amplifiers, and writing the amplified data back to the cells. Such refresh operations are performed even during a standby period, so that it is necessary to reduce the currents consumed during the refresh operations in order to suppress standby currents.

As a mechanism for reducing current consumption relating to refresh operations, provision may be made to provide a word line selecting shift register circuit corresponding one-to-one to each word line selecting decoder so as to select a word line selecting decoder based on the output of the word line selecting shift register circuit, rather than employing a configuration in which a counter circuit successively generates refresh addresses. With this provision, there is no need to charge and discharge the address signal lines laid out inside the semiconductor chip at the time of refresh operations, thereby making it possible to reduce the charging and discharging currents.

FIG. 1 is a diagram showing an example of the construction of a typical DRAM.

A DRAM 10 of FIG. 1 includes an address-&-command inputting unit 11, an I/O unit 12 for inputting/outputting data, cell array units 13-1 and 13-2, word decoder sets 14-1 and 14-2 for selecting word lines, amplifiers 15 for amplifying data signals when data is transmitted between the cell array units and the I/O unit, and Y decoders 16 for selecting data in the column direction. Each of the cell array units 13-1 and 13-2 is divided into a plurality of cell arrays 23. With respect to each of the cell arrays 23, a sense amplifier unit (S/A) 22 is provided to amplify a minute potential difference reflecting cell data on the bit lines, and a sub-word decoder (SWD) 21 is provided to selectively activate a word line.

In response to an entered address and command, a word line and a column line are selected, and a data read/write operation is performed with respect to a cell(s) positioned at the intersection of the selected word line and column line. In the case of write operation, data input into the I/O unit 12 is amplified by the amplifiers 15 and the sense amplifiers 22, followed by being stored in the selected cells. In the case of read operation, data read from the selected cells is amplified by the sense amplifiers 22 and the amplifiers 15, followed by being output to an exterior through the I/O unit 12.

In the case of refresh operations, a word line is selected according to an address for which refresh is required, and data is read from cells connected to the selected word line, Then, the data potentials are amplified by the sense amplifiers, followed by being stored back in the cells.

FIG. 2 is a drawing showing connections between word line selecting shift registers and word line selecting decoders provided for the purpose of refresh operations.

As shown in FIG. 2, one word line selecting shift register (S/R) 31 is provided for one word decoder 30 that corresponds to one main word line MWL. In the same manner as in FIG. 1, the left-side word decoder set 14-1 corresponds to the left-side cell array unit 13-1, and the right-side word decoder set 14-2 corresponds to the right-side cell array unit 13-2. Each word line selecting shift register 31 receives a control signal cntl. In response to each pulse of the control signal cntl, shift data such as "1" successively propagates from a given word line selecting shift register 31 to a next word line selecting shift register 31. A main word line MWL is selectively activated by the corresponding word decoder 30 where the corresponding word line selecting shift register 31 stores the shift data "1".

Between the left-side word decoder set 14-1 and the right-side word decoder set 14-2, the shift data propagates through a signal line A so as to continue to propagate in the opposite direction.

In the related-art configuration shown in FIG. 2, no mechanism is provided to find which one of the word line selecting shift registers 31 is in the selected state. Accordingly, it is also unknown when the shift data of the word line selecting shift registers 31 propagates from the left-hand side to the right-hand side or from the right-hand side to the left-hand side, making it impossible to ascertain which one of the left-side cell array unit 13-1 and the right-side cell array unit 13-2 is currently subjected to refresh operations. Because of this, provision is made such that the control signal cntl is always supplied to both of the word decoder sets 14-1 and 14-2, rather than being selectively supplied to one of the word decoder sets 14-1 and 14-2. This results in unnecessary current consumption.

[Patent Document 1] Japanese Patent Application Publication No. 2000-311487

SUMMARY OF THE INVENTION

It is a general object of the present invention to suppress current consumption in a semiconductor memory device having the configuration in which shift registers select a word line for refresh operation.

It is another and more specific object of the present invention to reduce current consumption consumed by a word decoder set not subjected to a refresh operation in a semiconductor memory device having the configuration in which shift registers select a word line for a refresh operation with respect to a plurality of word decoder sets.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

To achieve these and other advantages in accordance with the purpose of the invention, the invention provides a semiconductor memory device which includes a plurality of word decoders arranged in a plurality of columns, a plurality of word line selecting shift registers corresponding to the respective word decoders to indicate a word line subjected to refresh operation, and a shift control signal generating circuit operable to supply a shift control signal indicative of timing of shift operations to the plurality of word line selecting shift registers, wherein the said shift control signal generating circuit is configured to supply the shift control signal only to a column currently subjected to refresh operation among the plurality of columns.

In the semiconductor memory device as described above, the shift control signal is supplied only to a selected one of the word decoder columns, thereby making it possible to avoid needless current consumption in the unselected word decoder columns (word decoder sets).

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 3:
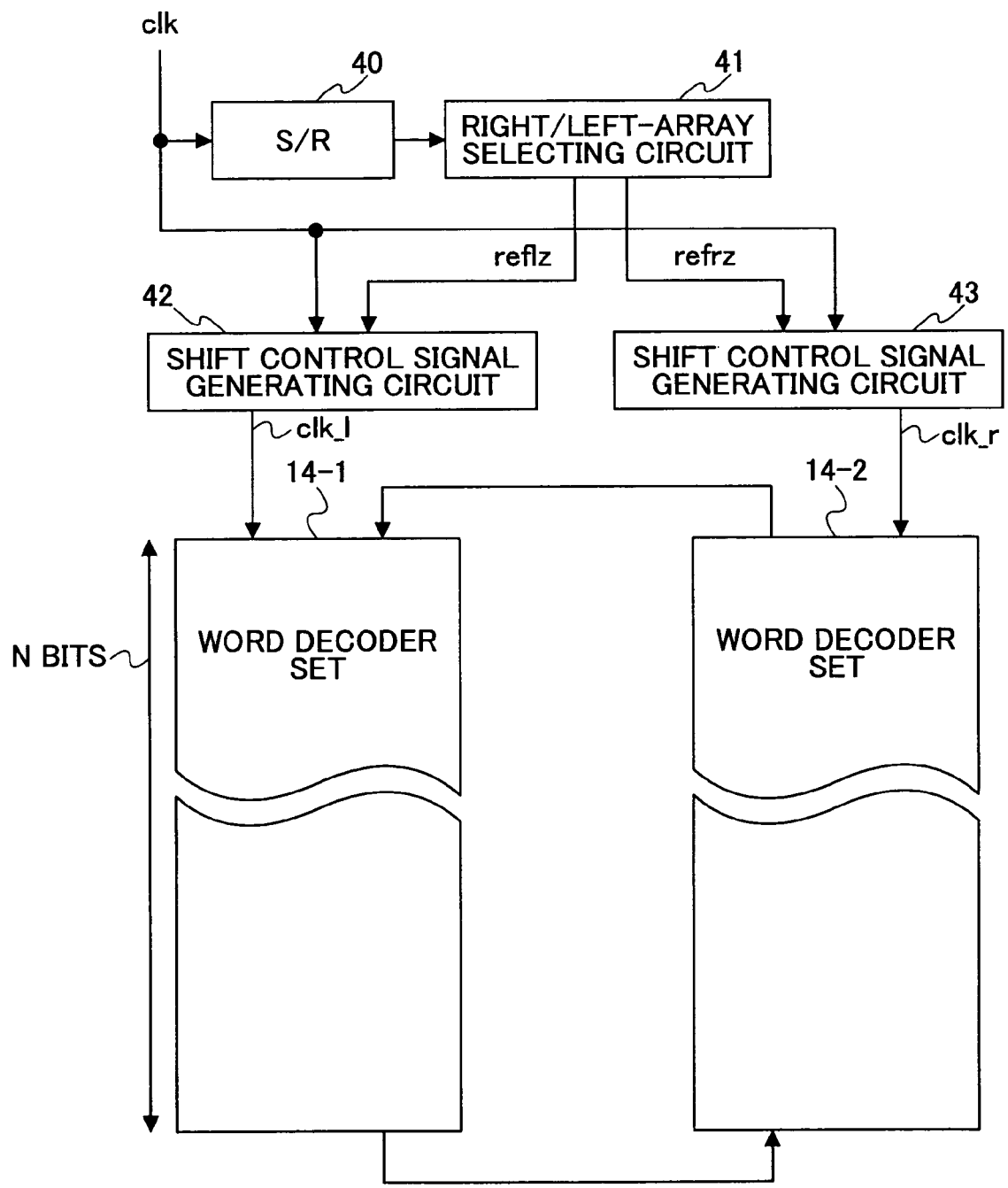
FIG. 3 is a diagram showing the construction of a first embodiment of a shift register controlling circuit according to the present invention.

FIG. 3 is a diagram showing the construction of a first embodiment of a shift register controlling circuit according to the present invention.

Figure 1:
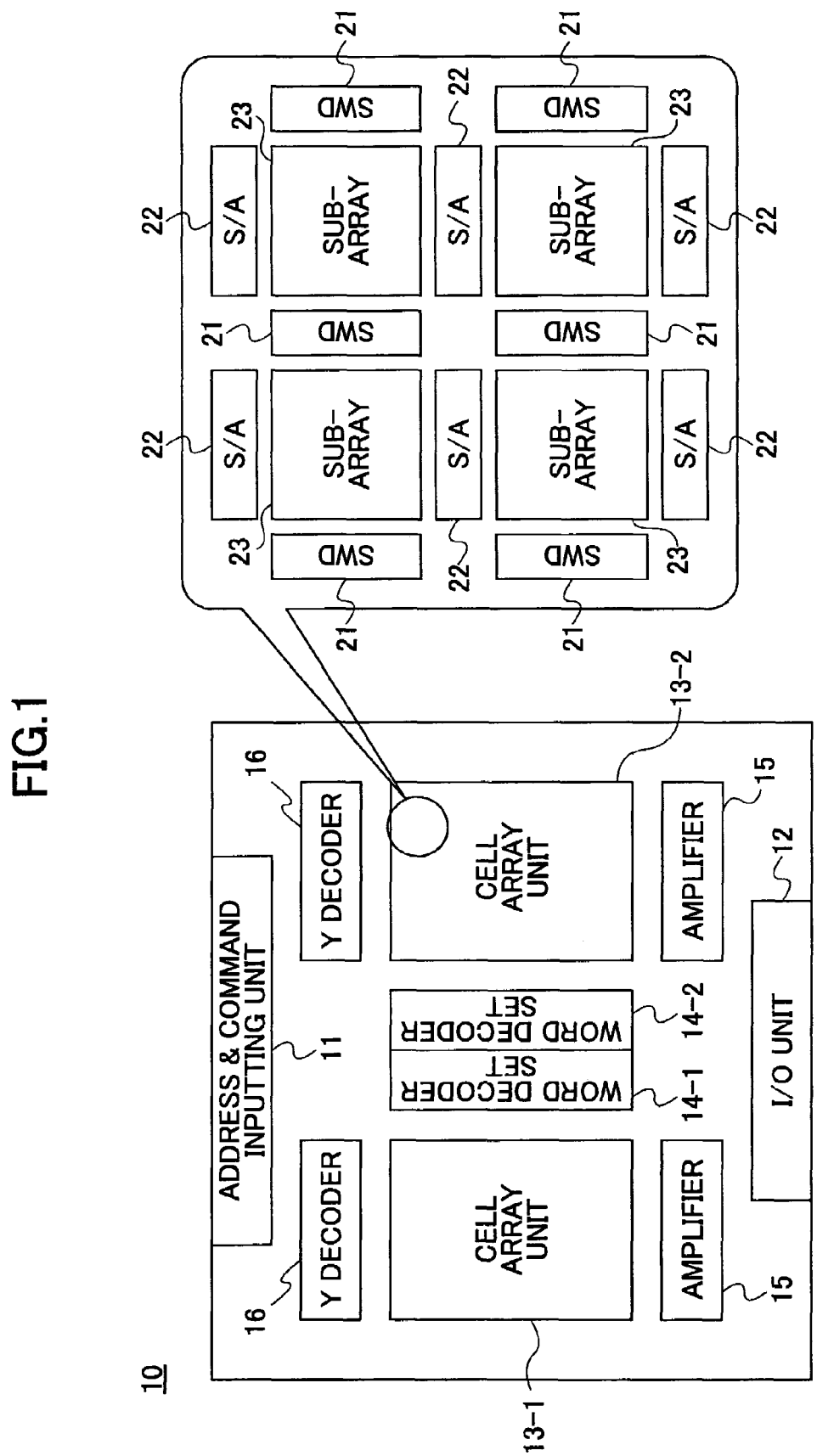
FIG. 1 is a diagram showing an example of the construction of a typical DRAM.
Figure 2:
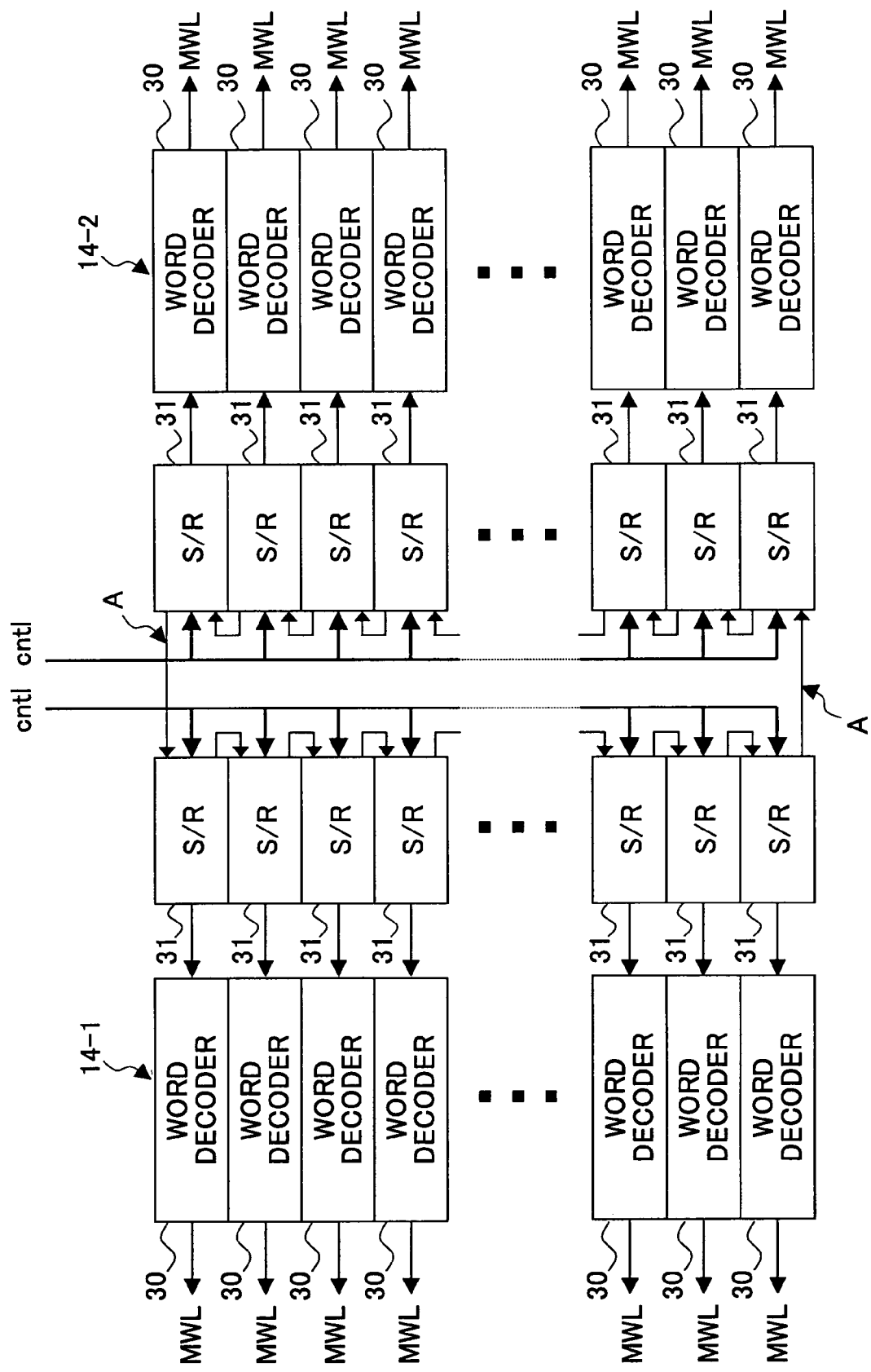
FIG. 2 is a drawing showing connections between word line selecting shift registers and word line selecting decoders provided for the purpose of refresh operations.

The shift register controlling circuit of FIG. 3 includes a shift register (S/R) 40, a right/left-array selecting circuit 41, a shift control signal generating circuit 42, and a shift control signal generating circuit 43. The shift control signal generating circuits 42 and 43 generate shift control signals clk_l and clk_r for provision to the word decoder sets 14-1 and 14-2, respectively. The word decoder sets 14-1 and 14-2 are as illustrated in FIG. 1 and FIG. 2. The shift control signal clk_l is supplied as the shift control signal cntl shown in FIG. 2 to the word decoder set 14-1 corresponding to the left-side cell array unit 13-1. The shift control signal clk_r is supplied as the shift control signal cntl shown in FIG. 2 to the word decoder set 14-2 corresponding to the right-side cell array unit 13-2.

In FIG. 3, the shift register 40 is provided separately from the word line selecting shift registers for selecting a word line selecting decoder at the time of refresh operations (e.g., the word line selecting shift registers 31 shown in FIG. 2), and is provided for the monitoring purpose to indicate which one of the word line selecting shift registers is in the selected state. Based on the output of the shift register 40, the right/left-array selecting circuit 41 generates signals reflz and refrz indicative of which one of the left and right cell array units is in the selected state. In response to the signals reflz and refrz, the shift control signal generating circuits 42 and 43 generate the shift control signal clk_l to be supplied to the left-side word decoder set 14-1 and the shift control signal clk_r to be supplied to the right-side word decoder set 14-2, respectively.

Figure 4:
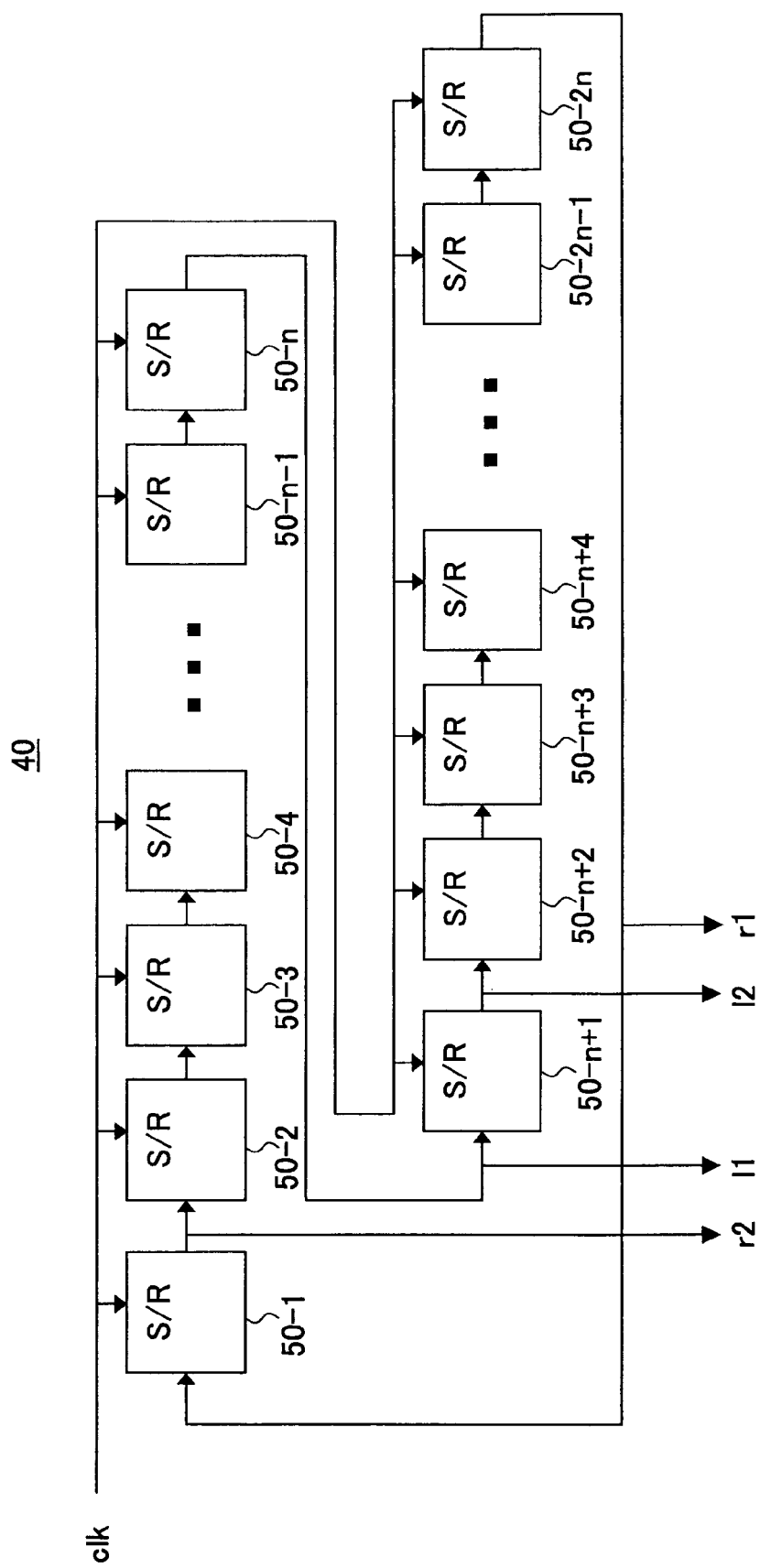
FIG. 4 is a diagram showing an example of the circuit construction of a shift register.

FIG. 4 is a diagram showing an example of the circuit construction of the shift register 40.

The shift register 40 of FIG. 4 includes 2n shift registers (S/R) 50-1 through 50-2n. The shift registers 50-1 through 50-2n receive a clock signal clk, and make a "1" bit propagate to a next shift register in synchronization with the clock signal clk. The clock signal clk is a pulse signal for requesting a shift at the time of refresh operations. Namely, one cycle of the clock signal clk corresponds to one cycle of refresh requests.

The output of the first shift register 50-1 is denoted as r2, the output of the n-th shift register 50-n denoted as l1, the output of the n+1-th shift register 50-n+1 denoted as l2, and the output of the 2n-th shift register 50-2n denoted as r1. These signals r1, r2, l1, and l2 are supplied to the right/left-array selecting circuit 41.

Figure 5:
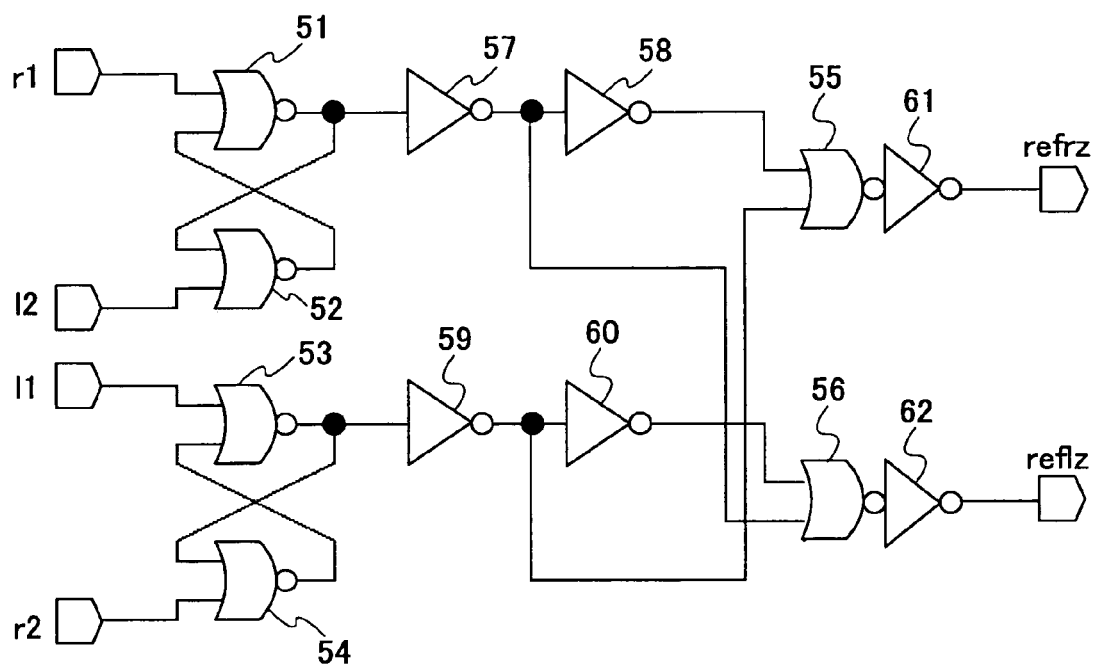
FIG. 5 is a diagram showing an example of the circuit construction of a right/left-array selecting circuit.

FIG. 5 is a diagram showing an example of the circuit construction of the right/left-array selecting circuit 41.

The right/left-array selecting circuit 41 includes NOR gates 51 through 56 and inverters 57 through 62. When the "1" bit is stored in the n−1-th shift register 50-n−1, for example, the signal reflz indicating the left-side word decoder set 14-1 is HIGH, and the signal refrz indicating the right-side word decoder set 14-2 is LOW. As the "1" bit propagates to the n-th shift register 50-n, the signal l1 becomes HIGH. In response, the output of the flip-flop comprised of the NOR gates 53 and 54 changes from HIGH to LOW, resulting the signal refrz indicative of the right side being changed from LOW to HIGH. At the next timing, the "1" bit propagates to the n+1-th shift register 50-n+1, which causes the signal l2 to become HIGH. In response, the output of the flip-flop comprised of the NOR gates 51 and 52 changes from LOW to HIGH, resulting in the signal reflz indicative of the left side being changed from HIGH to LOW.

When a transition is made from the left-side word decoder set 14-1 to the right-side word decoder set 14-2 as described above, the signal refrz indicative of the right-hand side changes from LOW to HIGH first, and, then, the signal reflz indicative of the left-hand side changes from HIGH to LOW at the next clock cycle. By the same token, when a transition is made from the right-side word decoder set 14-2 to the left-side word decoder set 14-1, the signal reflz indicative of the left-hand side changes from LOW to HIGH first, and, then, the signal refrz indicative of the right-hand side changes from HIGH to LOW at the next clock cycle.

Figure 6:
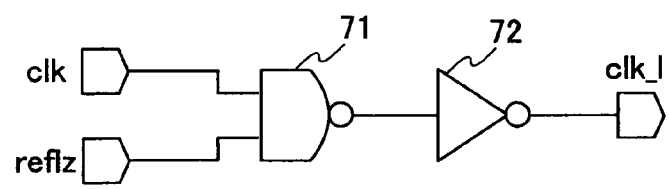
FIG. 6 is a diagram showing an example of the circuit construction of a shift control signal generating circuit.

FIG. 6 is a diagram showing an example of the circuit construction of the shift control signal generating circuit 42.

The shift control signal generating circuit 42 of FIG. 6 includes an NAND gate 71 and an inverter 72. As illustrated, the shift control signal generating circuit 42 is a simple AND circuit, and outputs the clock signal clk as the shift control signal clk_l only when the signal reflz indicative of the left-hand side is HIGH. The shift control signal generating circuit 43 has the same construction as that shown in FIG. 6, and outputs the clock signal clk as the shift control signal clk_r only when the signal refrz indicative of the right-hand side is HIGH.

As a result, the left-side shift control signal clk_l is supplied as a clock signal only when the left-side word decoder set 14-1 is selected, and the right-side shift control signal clk_r is supplied as a clock signal only when the right-side word decoder set 14-2 is selected. Accordingly, the control signal cntl is selectively supplied to only one of the word decoder sets 14-1 and 14-2, thereby avoiding needless current consumption in the unselected decoder set.

As was described in connection with the right/left-array selecting circuit 41 of FIG. 5, the signal reflz indicative of the left-hand side and the signal refrz indicative of the right-hand side overlap with each other for one clock cycle at the time of a transition when the selected position is shifted between the left-hand side and the right-hand side. Namely, both of these signals become HIGH at the same time for one clock cycle. Accordingly, the left-side shift control signal clk_l and the right-side shift control signal clk_r each generate one clock pulse simultaneously at the time of transition. This ensures that the shift data "1" of the word line selecting shift registers is handed over between the left-hand side and the right-hand side without a problem.

The word line selecting shift registers 31 provided in the word decoder set 14-1 and the word decoder set 14-2 may be configured into a hierarchical structure in which they are divided into a plurality of blocks.

Figure 7:
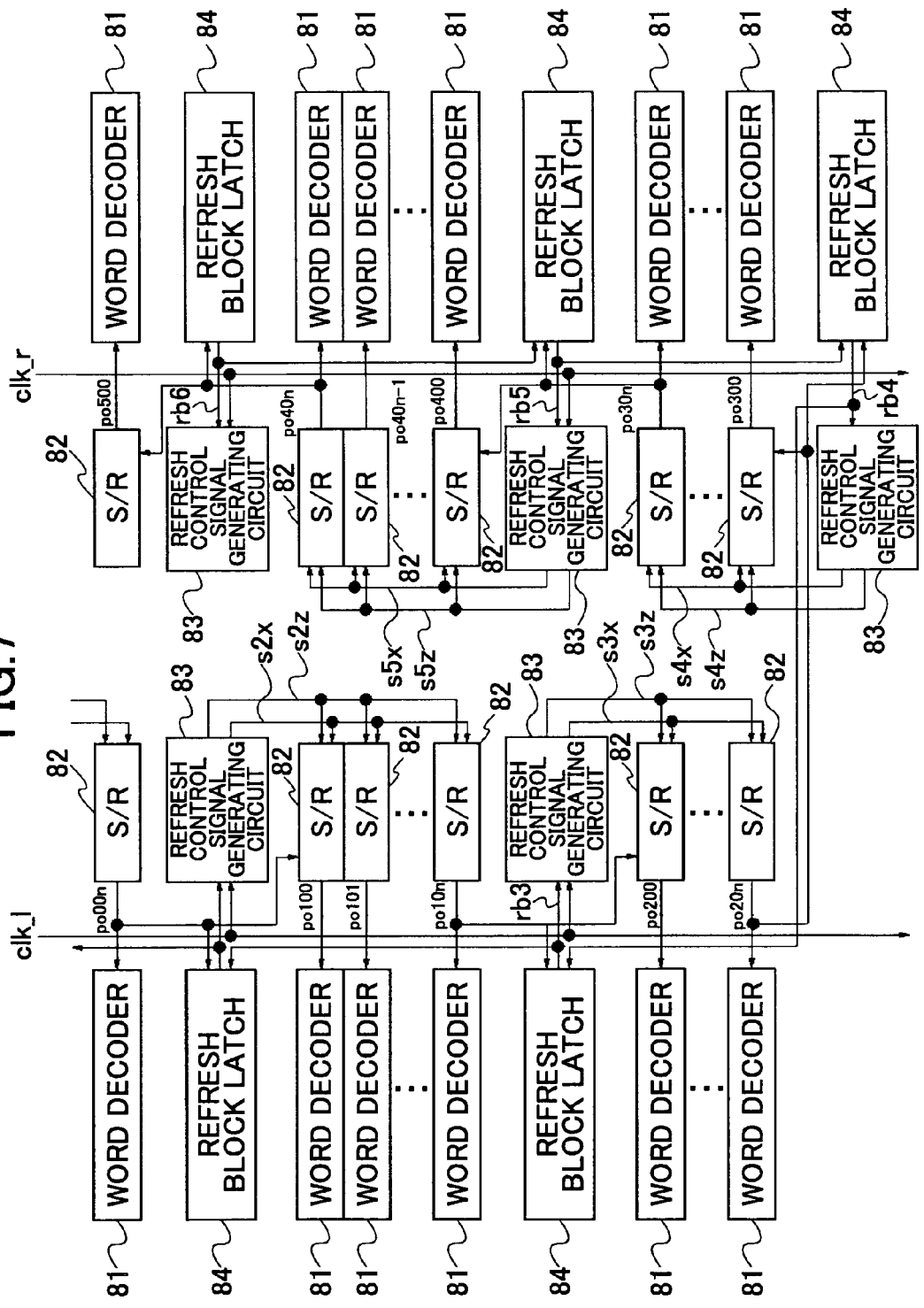
FIG. 7 is a drawing showing word line selecting shift registers and word decoders organized in a hierarchical structure.

FIG. 7 is a drawing showing word line selecting shift registers and word decoders organized in a hierarchical structure.

FIG. 7 shows word decoders 81, word line selecting shift registers (S/R) 82, refresh control signal generating circuits 83, and refresh block latches 84. The word decoders 81 are grouped into a plurality of blocks, and each of these blocks is provided with one refresh control signal generating circuit 83 and one refresh block latch 84. The refresh control signal generating circuits 83 corresponding to the left-hand-side word decoder line receive the shift control signal clk_l, and the refresh control signal generating circuits 83 corresponding to the right-hand-side word decoder line receive the shift control signal clk_r.

Each refresh block latch 84 receives and holds "1" from the last word line selecting shift register 82 of the preceding block, thereby indicating that the corresponding block is a block for selection. While the corresponding block is a block for selection, the output of the refresh block latch 84 is "1", which is supplied to the refresh control signal generating circuit 83. The refresh control signal generating circuit 83 generates shift control signals six and siz (i: an integer indicating a block) based on the shift control signal clk_l (or clk_r) while the output of the refresh block latch 84 is "1" (i.e., while the corresponding block is being selected). In synchronization with these shift control signals, the "1" data is successively shifted through a series of shift registers comprised of the word line selecting shift registers 82.

Figure 8:
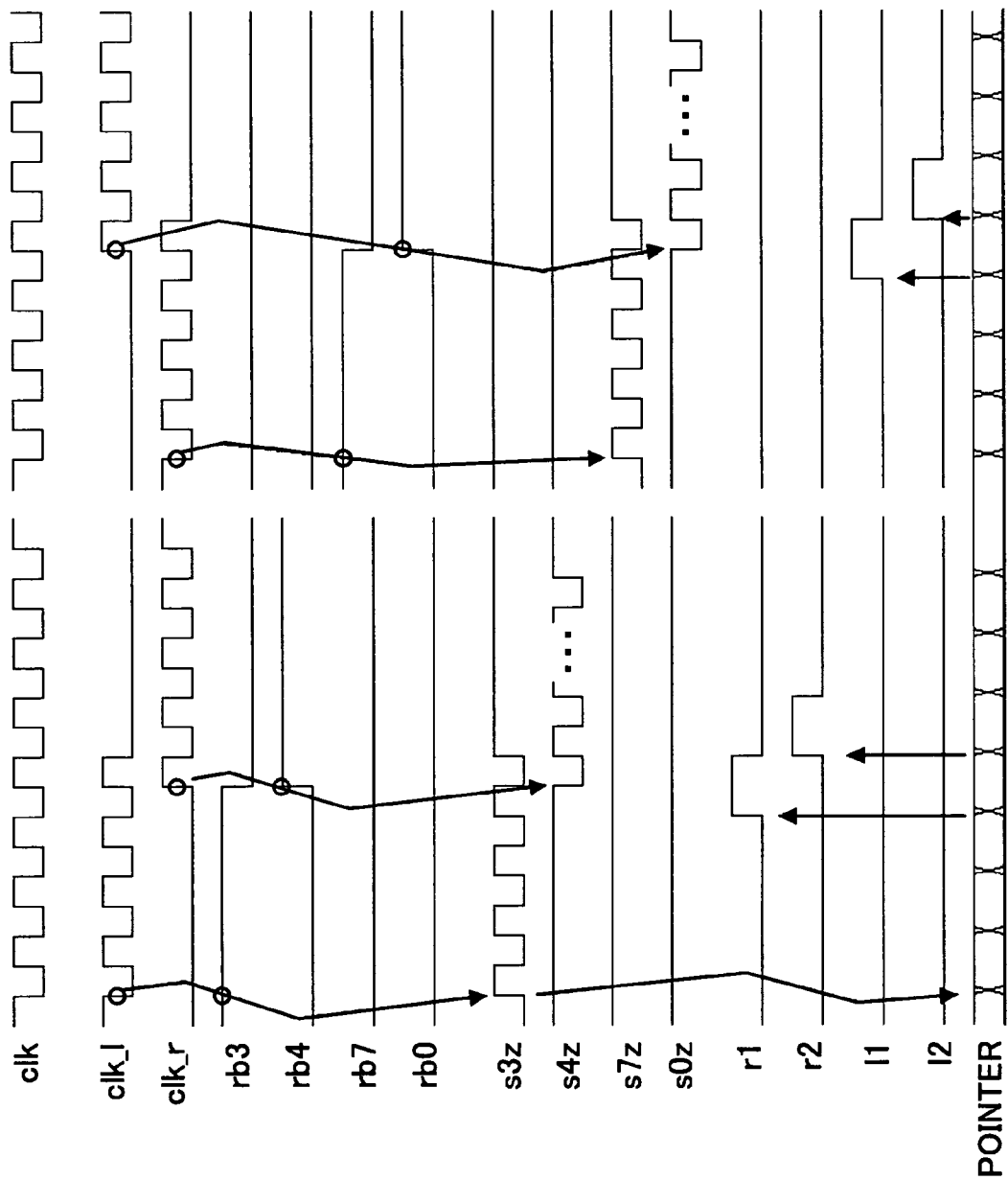
FIG. 8 is a timing chart showing the operation of the word line selecting shift registers having the hierarchical structure shown in FIG. 7.

FIG. 8 is a timing chart showing the operation of the word line selecting shift registers having the hierarchical structure shown in FIG. 7.

As shown in FIG. 8, only one of the shift control signals clk_l and clk_r (see FIG. 3) generated by the shift register 40, right/left-array selecting circuit 41, and shift control signal generating circuits 42 and 43 based on the clock signal clk is in the activated state, corresponding to which one of the right and left arrays is selected. Further, the shift control signals clk_l and clk_r are generated such that one clock pulse overlaps at the time of transition.

A signal rbi (i: an integer indicating a block) generated by the corresponding refresh block latch 84 becomes HIGH when the corresponding block is selected. As shown in FIG. 8, the shift control signal s3z (and s3x) supplied to the word line selecting shift registers 82 of the third block is activated during the period in which the signal rb3 is HIGH (i.e., when the third block is in the selected state). Further, the shift control signal s4z (and s4x) supplied to the word line selecting shift registers 82 of the fourth block is activated during the period in which the signal rb4 is HIGH (i.e., when the fourth block is in the selected state). As shown in FIG. 8, the shift control signal of a given block (e.g., s3z) and the shift control signal of the immediately following block (e.g., s4z) are generated such that one clock pulse overlap at the time of transition. In this manner, provision is made to generate one overlapping clock pulse not only at the time of a transition between the right and the left but also at the time of a transition between the blocks.

The signals r1, r2, l1, and l2 shown near the bottom of FIG. 8 are supplied from the shift register 40 to the right/left-array selecting circuit 41 (see FIG. 4 and FIG. 5).

Figure 9:
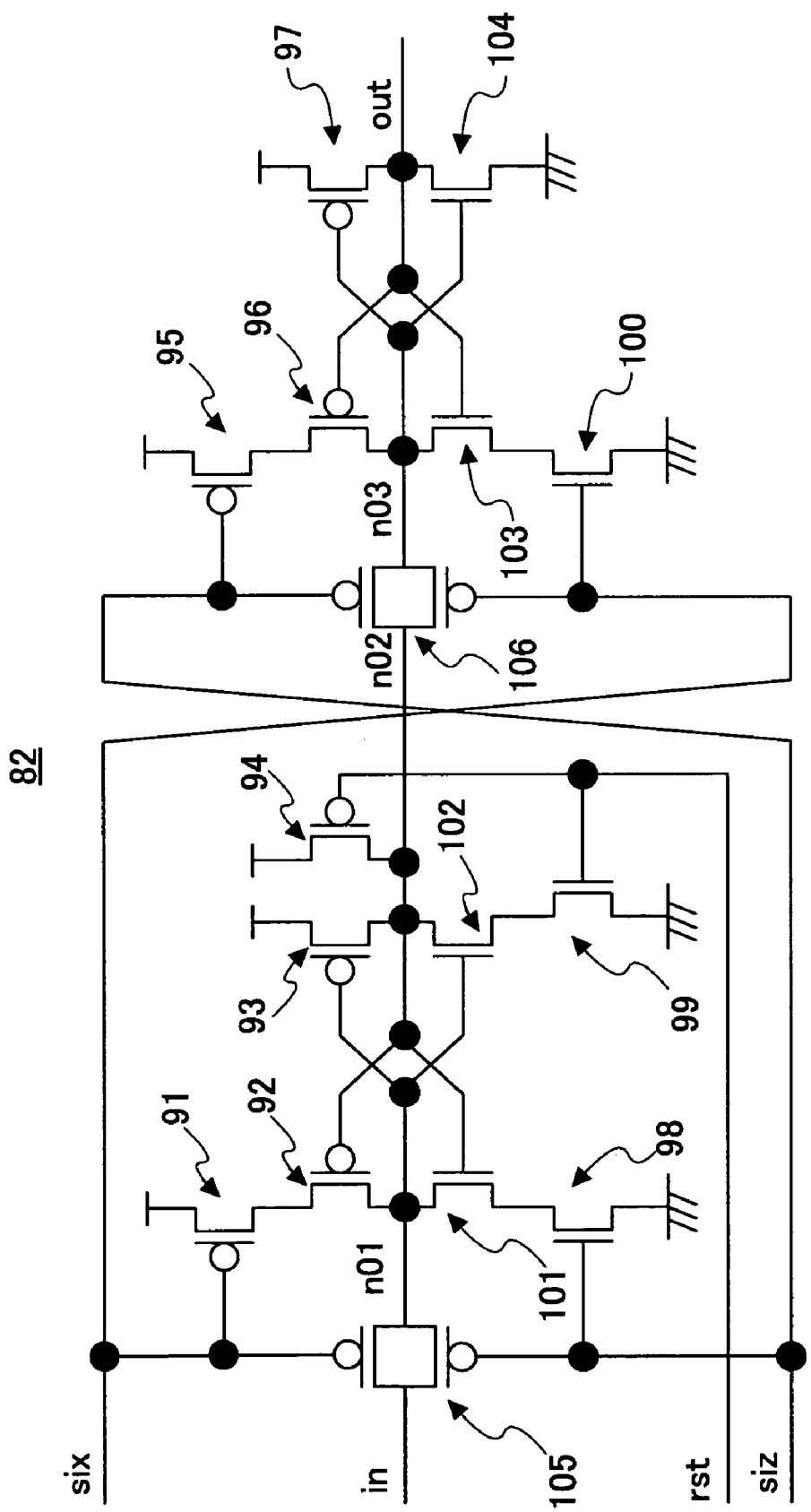
FIG. 9 is a diagram showing an example of the circuit construction of a word line selecting shift register.

FIG. 9 is a diagram showing an example of the circuit construction of the word line selecting shift register 82 (or word line selecting shift register 31).

The word line selecting shift register 82 of FIG. 9 includes PMOS transistors 91 through 97, NMOS transistors 98 through 104, and transfer gates 105 and 106. The transfer gates are each comprised of a PMOS transistor and an NMOS transistor connected in parallel. The PMOS transistors 92 and 93 and the NMOS transistors 101 and 102 constitute a first latch. Further, the PMOS transistors 96 and 97 and the NMOS transistors 103 and 104 constitute a second latch.

In response to the shift control signal six and siz (i: an integer indicative of a block) supplied from the refresh control signal generating circuit 83, the transfer gates 105 and 106 are opened or closed. With the transfer gate 105 being open, the first latch stores input data "in". As the transfer gate 105 closes and the transfer gate 106 opens, the data of the first latch is transferred to the second latch for storage therein. The data stored in the second latch will be retained therein until the transfer gate 106, subsequently closing, opens again at the next cycle.

In this manner, a register that retains data for one clock cycle is provided.

Figure 10:
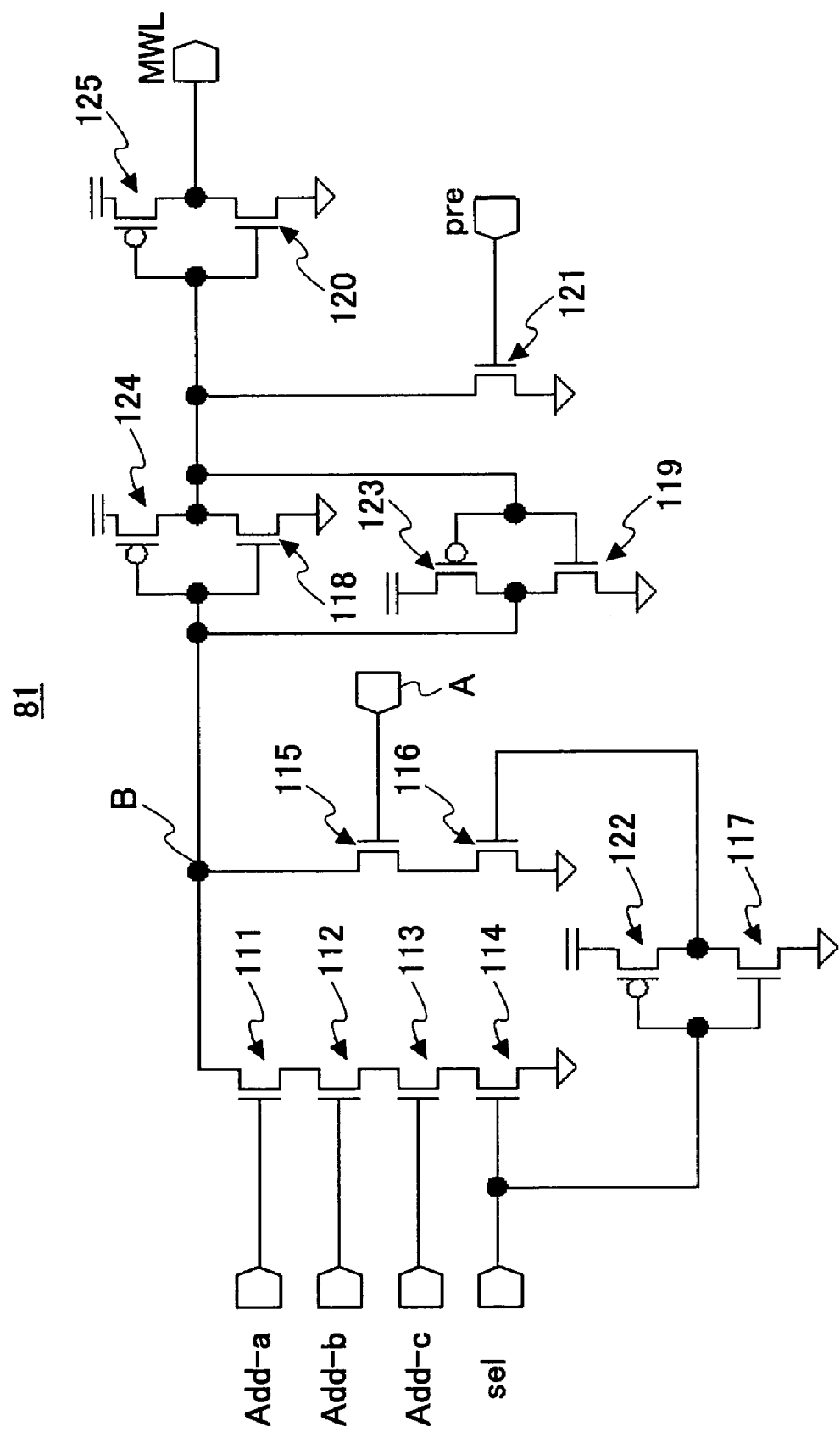
FIG. 10 is a drawing showing an example of the circuit construction of a word decoder.

FIG. 10 is a drawing showing an example of the circuit construction of the word decoder 81 (or the word decoder 30).

The word decoder of FIG. 10 includes NMOS transistors 111 through 121 and PMOS transistors 122 through 125. At the time of refresh operation, the selecting signal sel is set equal to LOW. As a result, the NMOS transistor 114 is tuned off, and the NMOS transistor 116 is turned on. A terminal A receives an output of the word line selecting shift register. As the word line selecting shift register selects the word decoder of interest, the terminal A becomes HIGH, resulting in the NMOS transistor 115 being conductive. In response, a node B is changed to LOW, which causes the main word line MWL to be placed in the selected state (LOW).

If access is requested from an exterior of the device while refresh operations are successively performed for each word line, the selecting signal sel is set equal to HIGH. In this case, the main word line MWL corresponding to a specified address is placed in the selected state in response to the address signal supplied from the exterior. In the case of FIG. 10, the node B becomes LOW to put the main word line MWL in the selected state (LOW) when all address signals Add-a through Add-c are HIGH.

Figure 11:
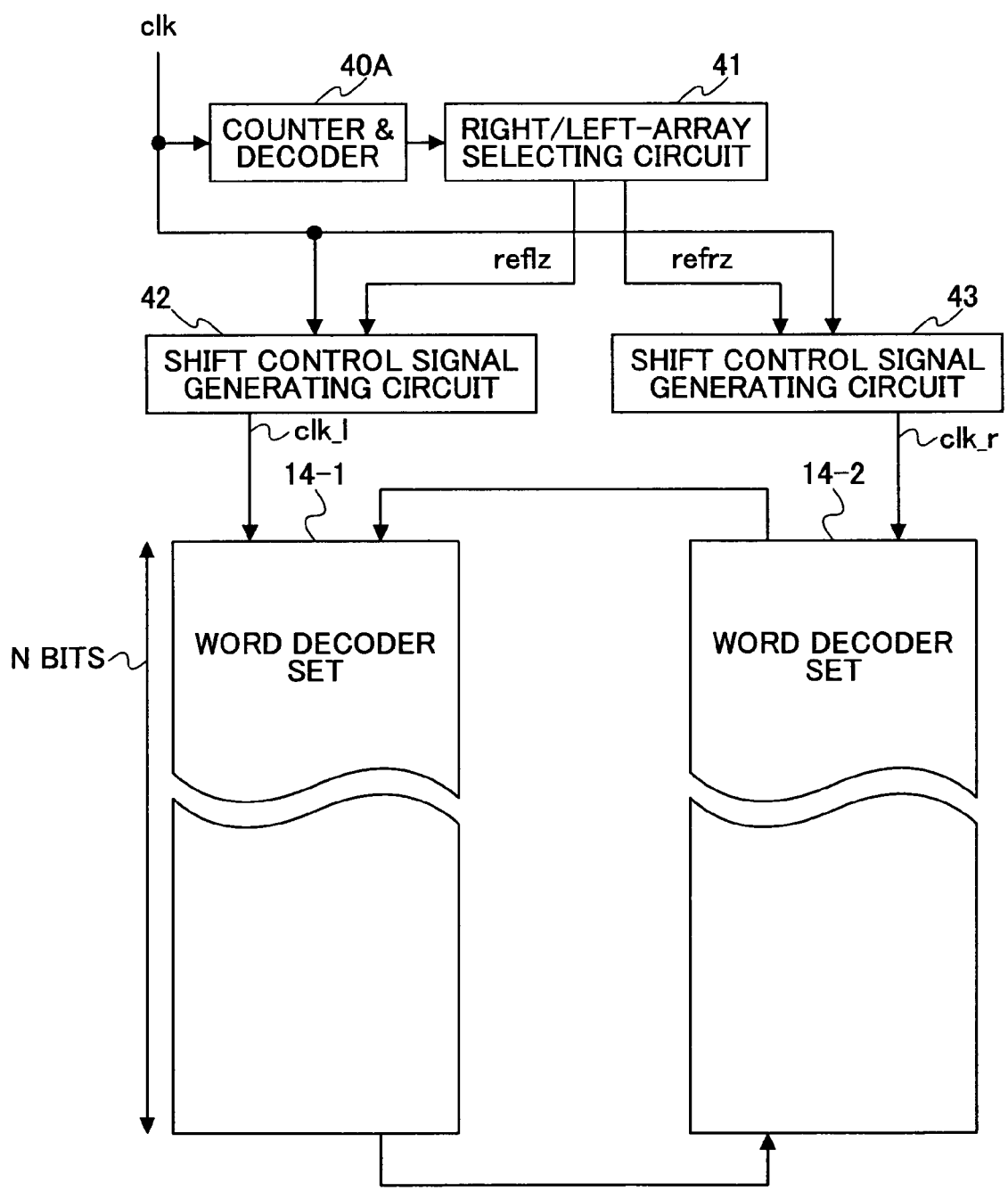
FIG. 11 is a drawing showing the construction of a second embodiment of the shift register controlling circuit according to the present invention.

FIG. 11 is a drawing showing the construction of a second embodiment of the shift register controlling circuit according to the present invention. In FIG. 11, the same elements as those of FIG. 3 are referred to by the same numerals, and a description thereof will be omitted.

In the construction shown in FIG. 11, the shift register 40 of the construction shown in FIG. 3 is replaced by a counter-&-decoder circuit 40A. The counter-&-decoder circuit 40A includes a counter for counting up (or counting down) in synchronization with the clock signal clk, and further includes a decoder for decoding the count of the counter. With this provision, it is possible to provide the function equivalent to that provided by the shift register 40. In should be noted that as decoder outputs, only the counter decoded values corresponding to the signals r1, r2, l1, and l2 of FIG. 4 may be output. This makes it possible to implement a decoder by use of a small-scale circuit.

Figure 12:
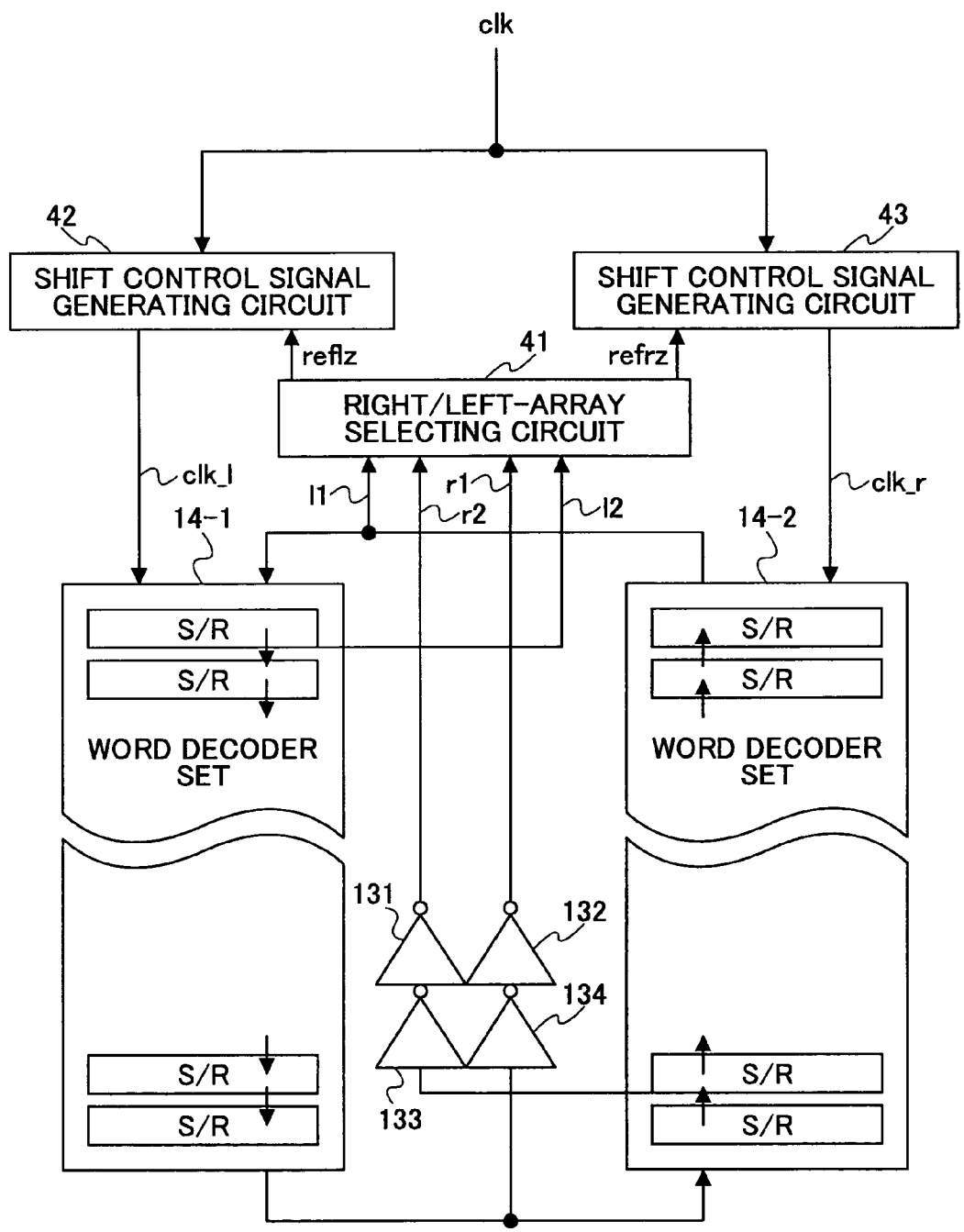
FIG. 12 is a drawing showing the construction of a third embodiment of the shift register controlling circuit according to the present invention.

FIG. 12 is a drawing showing the construction of a third embodiment of the shift register controlling circuit according to the present invention. In FIG. 12, the same elements as those of FIG. 3 are referred to by the same numerals, and a description thereof will be omitted.

In the construction shown in FIG. 12, a check as to which one of the right and left arrays is in the selected state is made by utilizing the outputs of the word line selecting shift registers 82 arranged in the word decoder sets 14-1 and 14-2, rather than using the shift register 40 as in the first embodiment or the counter-&-decoder circuit 40A as in the second embodiment. Specifically, the output of the word line selecting shift register 82 situated at the turning-back point from the left-hand side to the right-hand side is denoted as r1, and the output of the word line selecting shift register 82 situated at the turning-back point from the right-hand side to the left-hand side is denoted as l1. Further, the output of the word line selecting shift register 82 situated immediately following the turning-back point from the left-hand side to the right-hand side is denoted as r2, and the output of the word line selecting shift register 82 situated immediately following the turning-back point from the right-hand side to the left-hand side is denoted as l2.

To be specific, in FIG. 7, for example, an output po2 on of a word line selecting shift register 82 is r1, and an output po300 of a word line selecting shift register 82 is r2.

With this provision, signals r1, r2, l1, and l2 equivalent to those of FIG. 4 are obtained. The signals r1, r2, l1, and l2 extracted from the word decoder sets 14-1 and 14-2 as described above are supplied to the right/left-array selecting circuit 41. The operations of the right/left-array selecting circuit 41 and the shift control signal generating circuits 42 and 43 are the same as those of the first embodiment previously described.

It may be necessary to transfer the signals r1 and r2 through long-distance wires. To this end, buffers 131 through 134 are provided.

Figure 13:
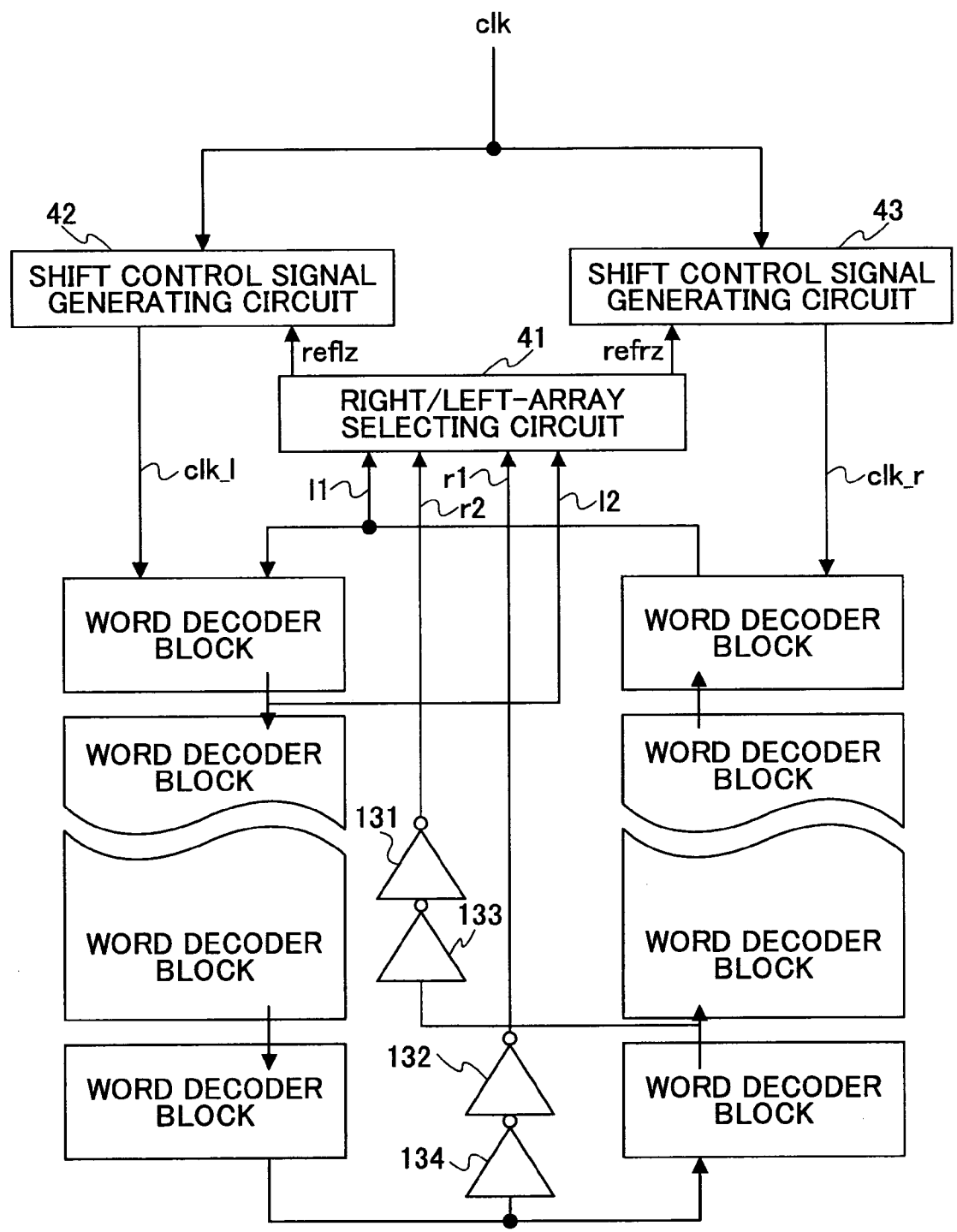
FIG. 13 is a drawing showing the construction of a fourth embodiment of the shift register controlling circuit according to the present invention.

FIG. 13 is a drawing showing the construction of a fourth embodiment of the shift register controlling circuit according to the present invention. In FIG. 13, the same elements as those of FIG. 3 are referred to by the same numerals, and a description thereof will be omitted.

In the third embodiment shown in FIG. 12, the outputs of the word line selecting shift registers 82 situated immediately following the turning-back points are extracted for use. Namely, in FIG. 7, for example, the output po300 of the word line selecting shift register 82 situated immediately following the turning-back point needs to be extracted. In such configuration, there is a need to extract signals from the word line selecting shift registers densely arranged in the word decoder sets, and it is difficult to secure sufficient space for wires for extracting signals.

In the fourth embodiment shown in FIG. 13, provision is made to extract an output signal from a word line selecting shift register situated at the last stage of the word decoder block situated immediately following a turning-back point, rather than extracting a signal from a word line selecting shift register situated immediately following the turning-back point. Namely, in FIG. 7, for example, what is to be extracted is not the output po300 of the word line selecting shift register 82 situated immediately following the turning-back point, but an output po30n of a word line selecting shift register 82 at the last stage of the word decoder block situated immediately following the turning-back point. Since there is sufficient space between word decoder blocks, such configuration as described here makes it possible to easily secure sufficient space for wires.

In the first through third embodiments, the output signals reflz and refrz of the right/left-array selecting circuit 41 overlap each other for one clock cycle at the time of transition between the right-hand side and the left-hand side. In the fourth embodiment, however, the output signals reflz and refrz of the right/left-array selecting circuit 41 end up overlapping for one block at the time of transition between the right-hand side and the left-hand side. Namely, if the number of the word line selecting shift registers 82 in one block is k, these signals overlap each other for a duration of k clock cycles. This slightly degrades the effect of current reduction. If division into blocks is finely made, however, such degradation is negligible.

Figure 14:
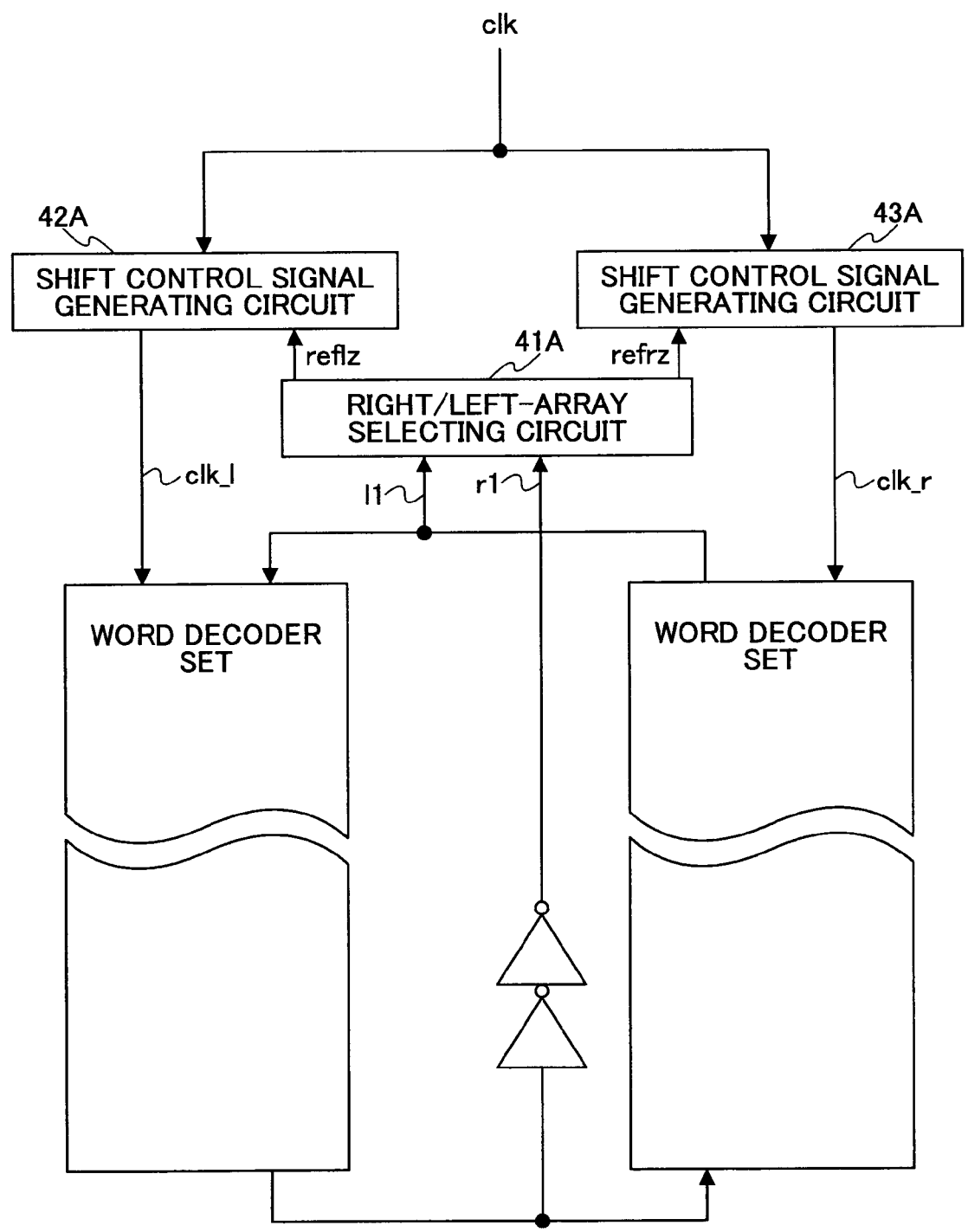
FIG. 14 is a drawing showing the construction of a fifth embodiment of the shift register controlling circuit according to the present invention.

FIG. 14 is a drawing showing the construction of a fifth embodiment of the shift register controlling circuit according to the present invention. In FIG. 14, the same elements as those of FIG. 3 are referred to by the same numerals, and a description thereof will be omitted.

In the fifth embodiment, signals extracted from the word line selecting shift registers include only the signals r1 and l1 at the turning-back point. In addition, a right/left-array selecting circuit 41A is provided in place of the right/left-array selecting circuit 41 used in the first through fourth embodiments, and receives the signals r1 and l1. Further, shift control signal generating circuits 42A and 43A are provided in place of the shift control signal generating circuits 42 and 43 used in the first through fourth embodiments.

Figure 15:
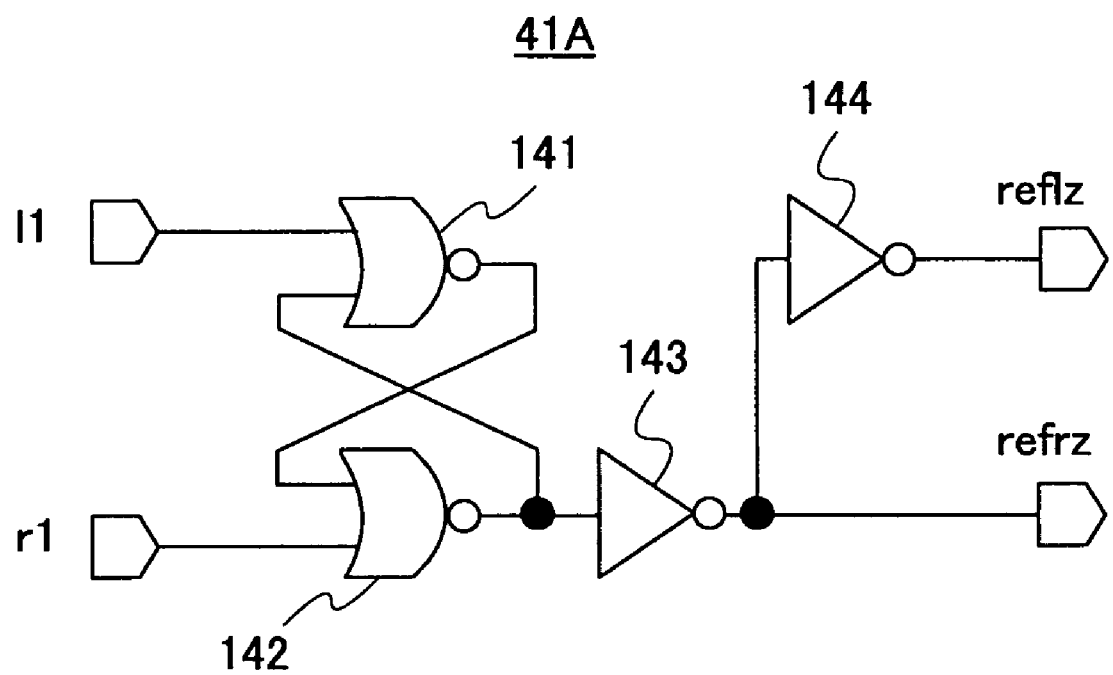
FIG. 15 is a drawing showing an example of the circuit construction of a right/left-array selecting circuit.

FIG. 15 is a drawing showing an example of the circuit construction of the right/left-array selecting circuit 41A.

As shown in FIG. 15, the right/left-array selecting circuit 41A includes NOR gates 141 and 142 and inverters 143 and 144. Each time the signal r1 or l1 indicating a turning back becomes HIGH, the flip-flop comprised of the NOR gates 141 and 142 is inverted as to its state. As a result, the output signals reflz and refrz serve to indicate which one of the right and left word decoder sets is in the selected sate.

Figure 16:
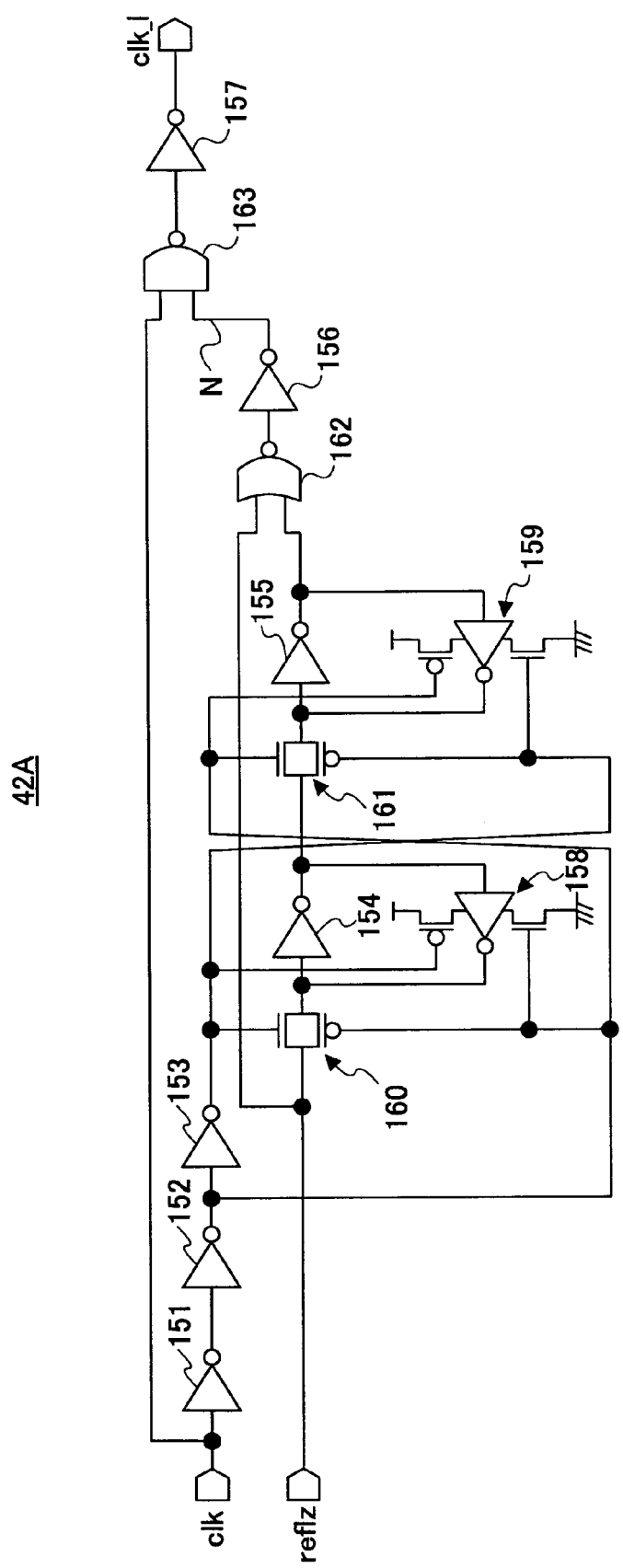
FIG. 16 is a circuit diagram showing the circuit construction of a shift control signal generating circuit.

FIG. 16 is a circuit diagram showing the circuit construction of the shift control signal generating circuit 42A. The shift control signal generating circuit 43A has the same circuit construction.

The shift control signal generating circuit 42A of FIG. 16 includes inverters 151 through 157, gated inverters 158 and 159, transfer gates 160 and 161, a NOR gate 162, and an AND gate 163. The inverter 154 and the gated inverter 158 together form a first latch. The inverter 155 and the gated inverter 159 constitute a second latch. When the signal reflz is HIGH, an node N that is an inverse of the output of the NOR gate 162 is fixed to HIGH, so that the input clock signal clk is output as the shift control signal clk_l without any change. The signal reflz changes to LOW thereafter. Since the output of the second latch remains HIGH despite this change, the node N also remains HIGH. Then, the change to LOW of the signal reflz propagates through the first latch and the second latch, resulting in the node N changing to LOW one clock cycle later. With the node N changing to LOW, the shift control signal clk_l is placed in an inactive state (fixed to LOW).

As described above, the shift control signal generating circuits 42A and 43A have the period extending function to extend the duration of shift control signal generation by one clock cycle of refresh requests, providing an extension after the switching of selected states between the right-hand side and the left-hand side.

Figure 17:
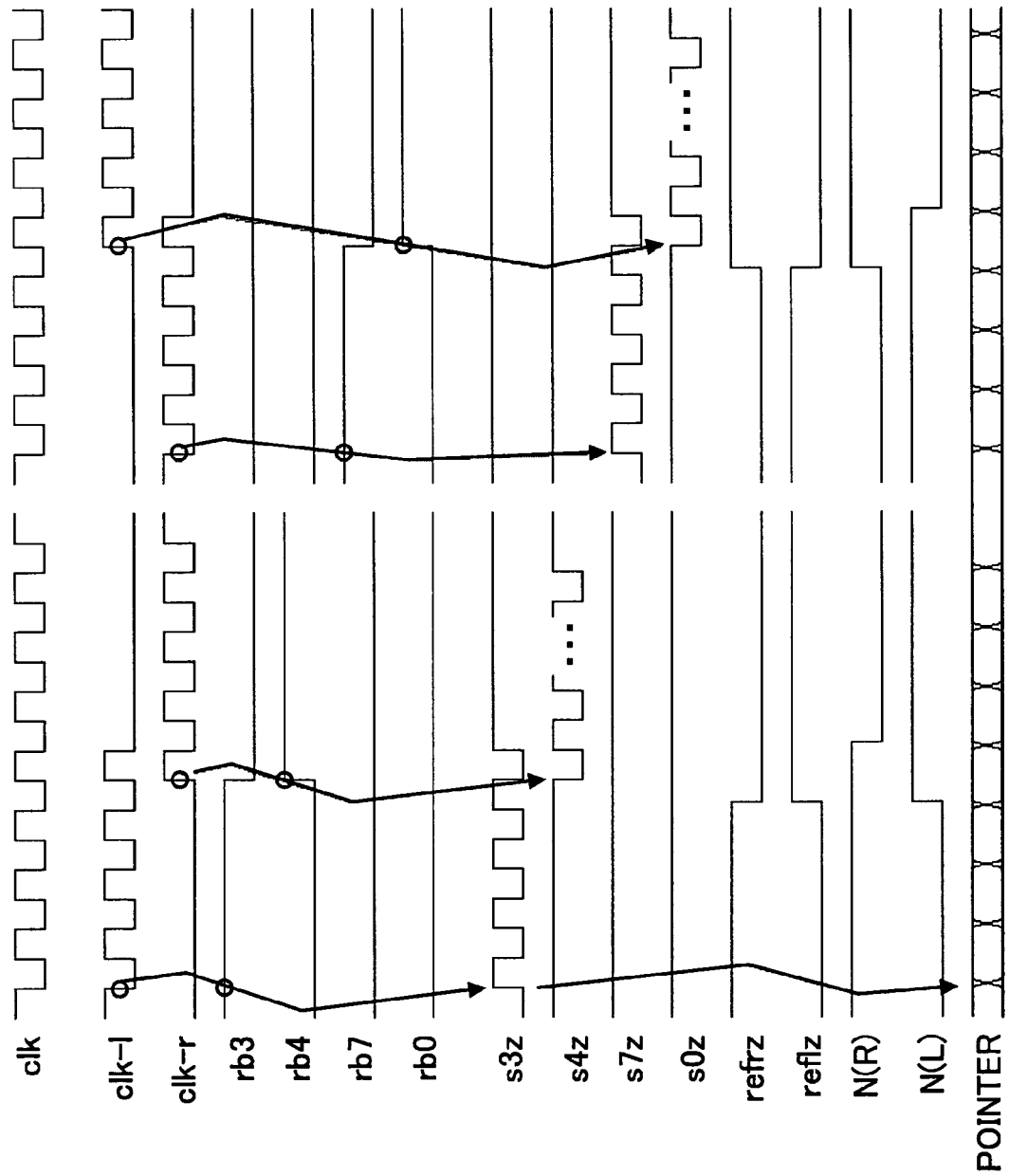
FIG. 17 is a timing chart showing the operation of the word line selecting shift registers having a hierarchical structure shown in FIG. 7 with respect to the fifth embodiment.

FIG. 17 is a timing chart showing the operation of the word line selecting shift registers having a hierarchical structure shown in FIG. 7 with respect to the fifth embodiment. Among the signals shown in FIG. 17, signals refrz, reflz, N(R), and N(L) illustrated near the bottom of the figure differ from those shown in FIG. 8.

The signals refrz and reflz serve to indicate which one of the right and left word decoder sets is in the selected state, as was described in connection with FIG. 15. The signals N(L) and N(R) are the signal of the node N of the shift control signal generating circuit 42A (see FIG. 16) and the signal of the node N of the shift control signal generating circuit 43A, respectively. As was described in connection with FIG. 16, the signals N(L) and N(R) are extended by one cycle compared to the signals reflz and refrz, respectively. Because of this, the shift control signals clk_l and clk_r overlap each other by one clock cycle at the time of switching between the right-hand side and the left-hand side.

Figure 18:
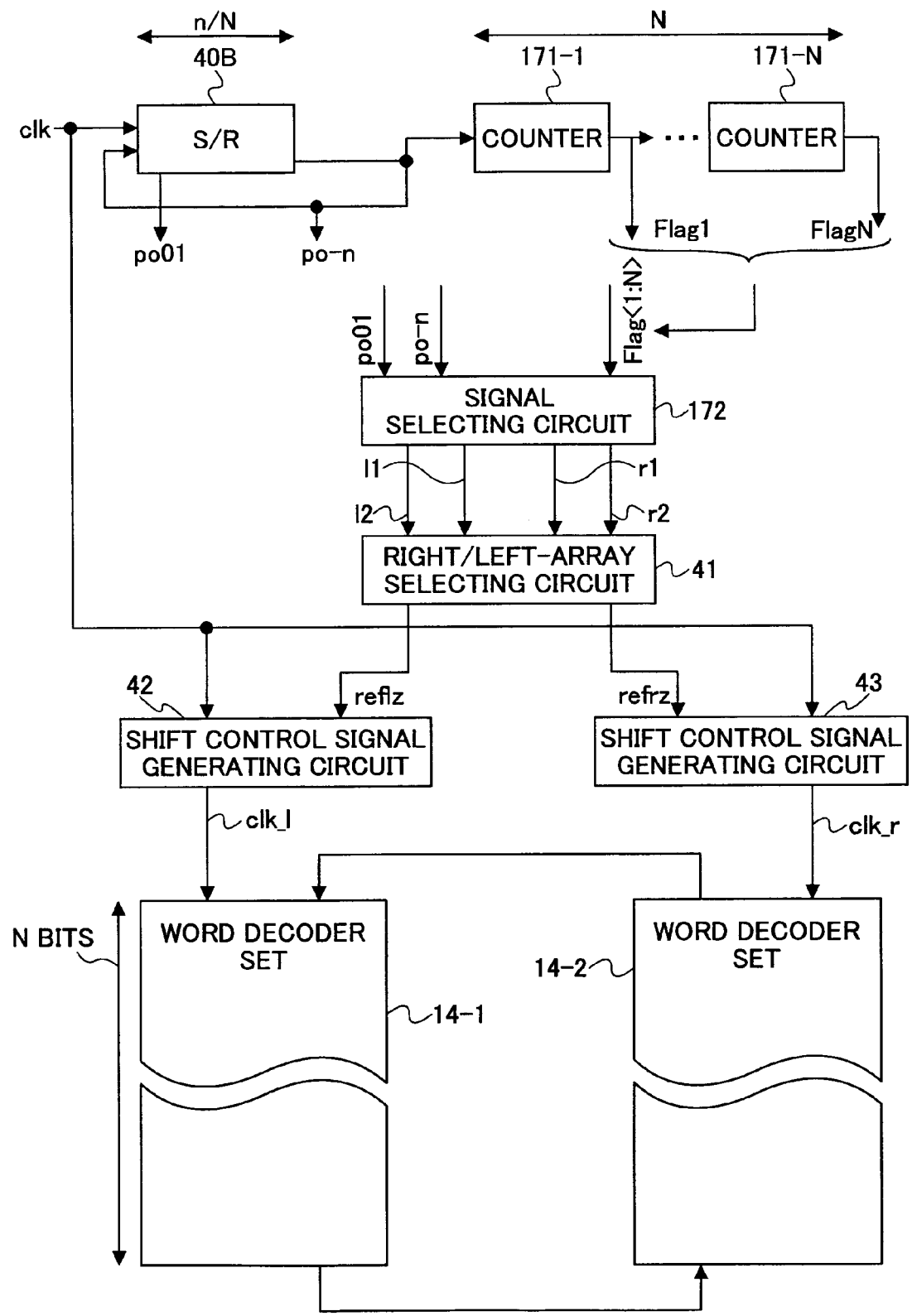
FIG. 18 is a drawing showing the construction of a sixth embodiment of the shift register controlling circuit according to the present invention.

FIG. 18 is a drawing showing the construction of a sixth embodiment of the shift register controlling circuit according to the present invention. In FIG. 18, the same elements as those of FIG. 3 are referred to by the same numerals, and a description thereof will be omitted.

The sixth embodiment relates to a configuration in which a small-scale shift register circuit is used as a monitor-purpose shift register circuit. In the sixth embodiment shown in FIG. 18, a shift register (S/R) 40B, counters 171-1 through 171-N, and a signal selecting circuit 172 are provided in place of the 2n-bit shift register 40 shown in FIG. 3. The shift register 40B is an n/N-bit shift register (i.e., a shift register circuit comprised of n/N stages) where n is the number of the word line selecting shift registers provided in one line. Further, there are a total of N counters 171-1 through 171-N.

The counters 171-1 through 171-N count up by one each time data "1" shifts all the way to the last stage (n/N-th stage) in the monitoring-purpose shift register 40B. From the monitoring-purpose shift register 40B, the first stage output and the n-th state output are extracted and supplied to the signal selecting circuit 172 as po00 and po-n. Further, the carry-up signals of the respective counters 171-1 through 171-N are also supplied to the signal selecting circuit 172 as Flag1, Flag2, . . . , and FlagN. The signal selecting circuit 172 performs a logic operation on these supplied signals to generate the signals r1, r2, l1, and l2.

Figure 19:
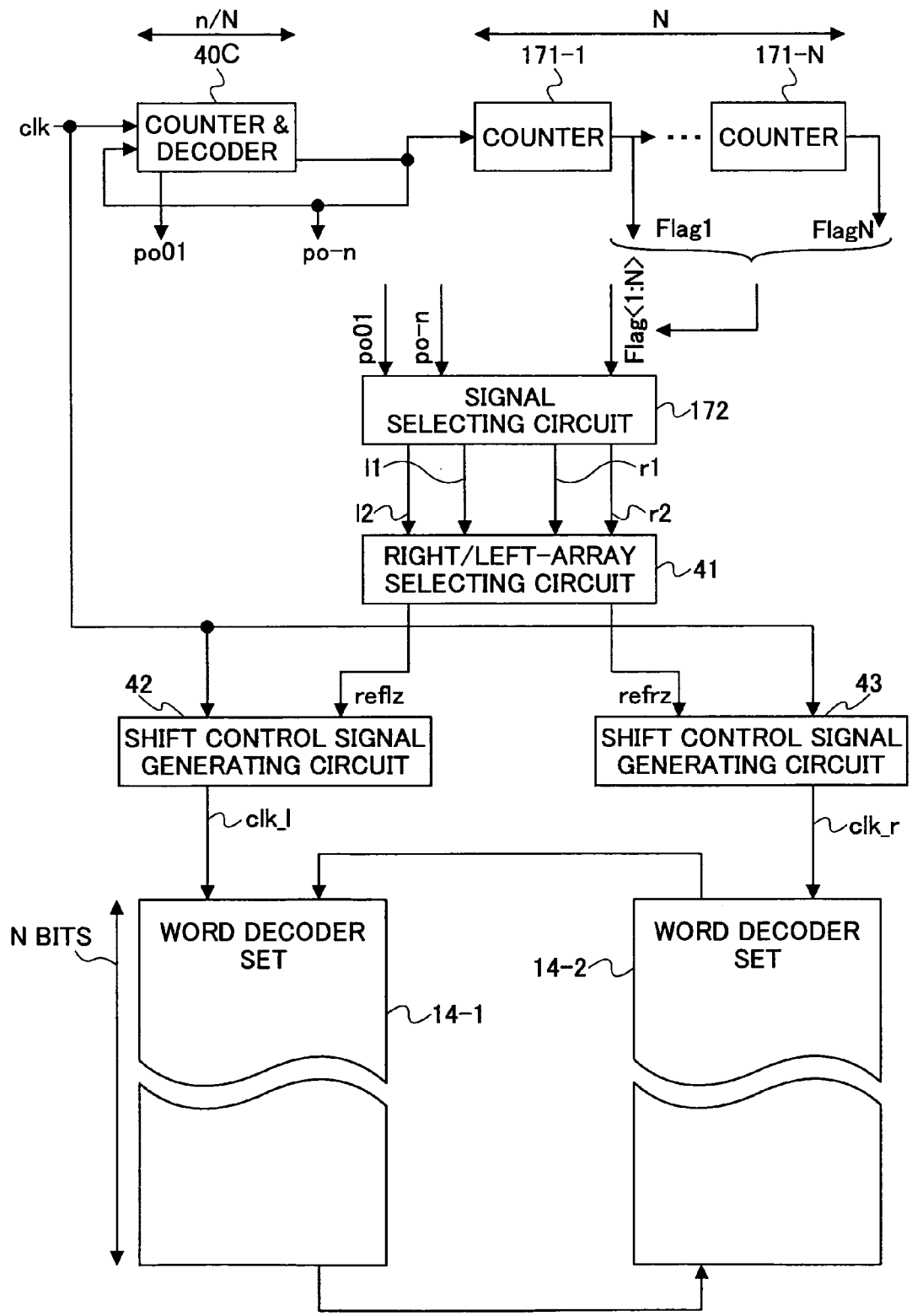
FIG. 19 is a drawing showing the construction of a seventh embodiment of the shift register controlling circuit according to the present invention.

FIG. 19 is a drawing showing the construction of a seventh embodiment of the shift register controlling circuit according to the present invention. In FIG. 19, the same elements as those of FIG. 18 are referred to by the same numerals, and a description thereof will be omitted.

In FIG. 19, the shift register 40B is replaced by a counter-&-decoder circuit 40C. The counter-&-decoder circuit 40C includes a counter for counting up (or counting down) in synchronization with the clock signal clk, and further includes a decoder for decoding the count of the counter. With this provision, it is possible to provide the function equivalent to that provided by the shift register 40B. In should be noted that as decoder outputs, only the counter decoded values corresponding to the signals r1, r2, l1, and l2 may be output. This makes it possible to implement a decoder by use of a small-scale circuit.

Figure 20:
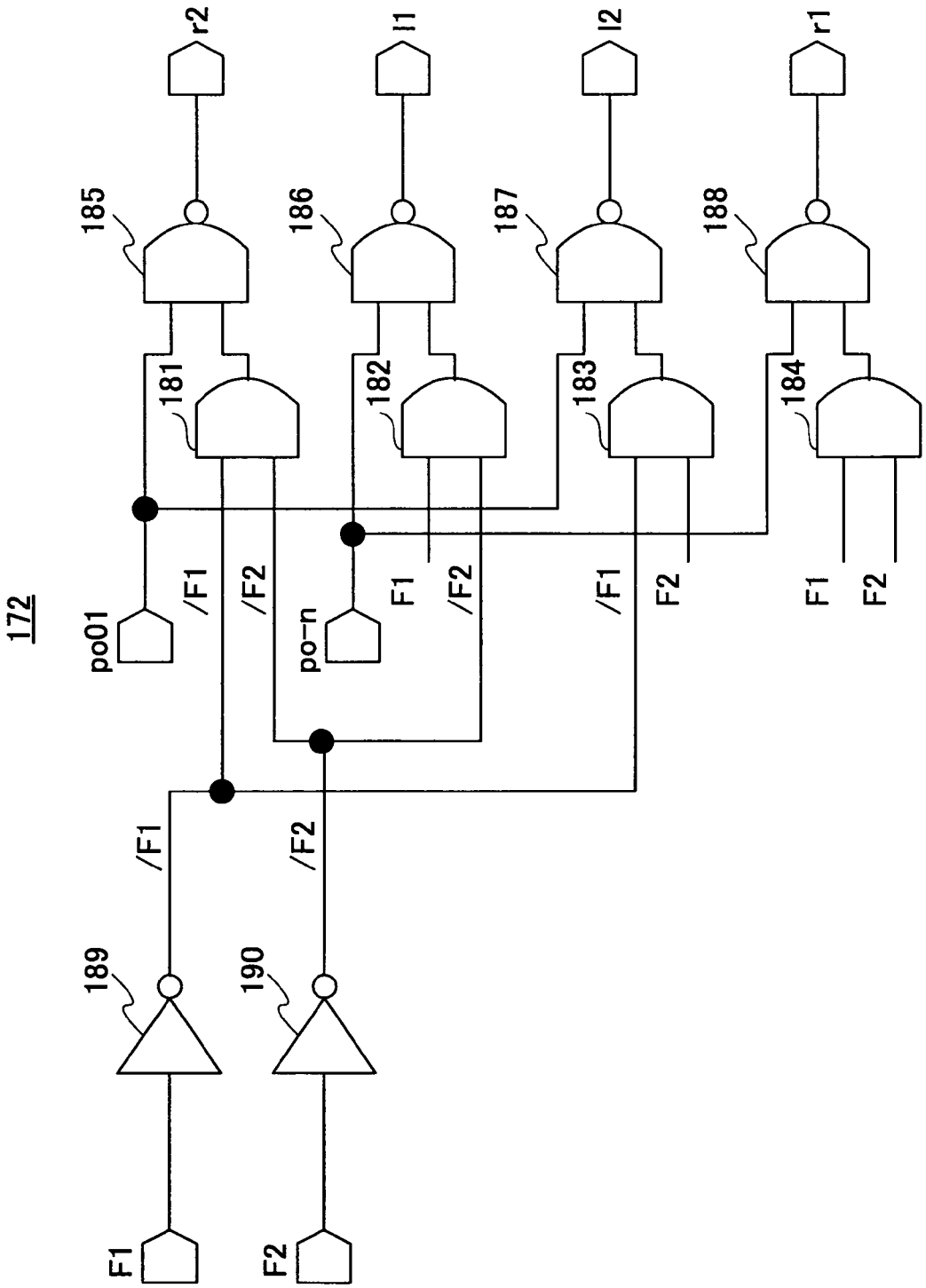
FIG. 20 is a circuit diagram showing an example of the circuit construction of a signal selecting circuit.

FIG. 20 is a circuit diagram showing an example of the circuit construction of the signal selecting circuit 172.

The signal selecting circuit 172 of FIG. 20 is directed to an example in which N is 2, and includes AND gates 181 through 184, NAND gates 185 through 188, and inverters 189 and 190. An output F1 (shown as Flag1 in FIG. 18 and FIG. 19) of the first stage counter circuit 171-1 and an output F2 (shown as Flag2 in FIG. 18 and FIG. 19) of the second stage counter circuit 171-2 are decoded by the AND gates 181 through 184 and the inverters 189 and 190, thereby determining which lap is being performed by the shift register 40B or 40C. Based on this determination, either the first-stage output po00 or the n-th-stage output po-n is selectively output. This successfully generates the signals r1, r2, l1, and l2 as signals indicating the occurrence of switching between the word line selecting shift register lines and also as signals indicating advancement of one stage after such switching.

Although the present invention has been described with reference to embodiments, the present invention is not limited to these embodiments. Various variations and modifications may be made without departing from the scope of the Claimed invention.

For example, the above embodiments have been described with reference to an example in which the word decoder sets are arranged in two lines. Even if three or more lines are provided, shift control signals may be generated in the same manner as in the disclosed embodiments so as to deactivate the shift control signals in the unselected lines, thereby reducing needless power consumption.

What is claimed is:

1. A semiconductor memory device, comprising:
   a plurality of word decoders arranged in a plurality of columns;
   a plurality of word line selecting shift registers corresponding to the respective word decoders to indicate a word line subjected to refresh operation; and
   a shift control signal generating circuit operable to supply a shift control signal indicative of timing of shift operations to the plurality of word line selecting shift registers,
   wherein said shift control signal generating circuit is configured to supply the shift control signal only to a column currently subjected to refresh operation among the plurality of columns.

2. The semiconductor memory device as claimed in claim 1, wherein at timing at which a column subjected to refresh operation is switched from a first column to a second column of the plurality of columns, said shift control signal generating circuit supplies the shift control signal to both the first column and the second column temporarily.

3. The semiconductor memory device as claimed in claim 1, further comprising a monitoring-purpose shift register configured to shift in synchronization with said word line selecting shift register, wherein said shift control signal generating circuit is configured to control a destination to which the shift control signal is supplied based on a signal supplied from said monitoring-purpose shift register.

4. The semiconductor memory device as claimed in claim 1, further comprising:
   a counter circuit to perform counting in synchronization with said word line selecting shift register; and
   a decoder circuit to decode an output of said counter circuit,
   wherein said shift control signal generating circuit is configured to control a destination to which the shift control signal is supplied based on a signal output from said decoder circuit.

5. The semiconductor memory device as claimed in claim 1, wherein an output signal of a word line selecting shift register corresponding to a last-stage word decoder in each of the plurality of columns is extracted as a first check signal, and said shift control signal generating circuit is configured to control a destination to which the shift control signal is supplied based on the first check signal.

6. The semiconductor memory device as claimed in claim 5, wherein an output signal of a word line selecting shift register corresponding to a word decoder situated at a stage having a predetermined ordinal position in each of the plurality of columns is extracted as a second check signal, and said shift control signal generating circuit is configured to control the destination to which the shift control signal is supplied based on the first check signal and the second control signal, thereby supplying the shift control signal to both a first column and a second column temporarily at timing at which a column subjected to refresh operation is switched from the first column to the second column among the plurality of columns.

7. The semiconductor memory device as claimed in claim 6, wherein the word decoder situated at the stage having the predetermined ordinal position is a first-stage word decoder in each column.

8. The semiconductor memory device as claimed in claim 6, wherein said plurality of word decoders are grouped into a plurality of blocks in each of said plurality of columns, and the word decoder situated at the stage having the predetermined ordinal position is a last-stage word decoder of a first block in each column.

9. The semiconductor memory device as claimed in claim 1, wherein one of said word decoders receives an output of a corresponding one of the word line selecting shift registers, an address signal, and a selecting signal, and is configured to select a word line in response to a decoding result of the address signal if the selecting signal is at a first level, and to select the word line in response to the output of the corresponding one of the word line selecting shift registers if the selecting signal is at a second level.

10. The semiconductor memory device as claimed in claim 9, wherein the selecting signal becomes the first level when said semiconductor memory device performs an operation that allows access from an exterior to be made, and becomes the second level when said semiconductor memory device performs a refresh operation.

* * * * *